United States Patent
Shetty et al.

(10) Patent No.: US 9,436,392 B1
(45) Date of Patent: Sep. 6, 2016

(54) ACCESS-BASED EVICTION OF BLOCKS FROM SOLID STATE DRIVE CACHE MEMORY

(71) Applicant: Nimble Storage, Inc., San Jose, CA (US)

(72) Inventors: Pradeep Shetty, San Jose, CA (US); Sandeep Karmarkar, San Jose, CA (US); Senthil Kumar Ramamoorthy, San Jose, CA (US); Umesh Maheshwari, San Jose, CA (US); Vanco Buca, San Jose, CA (US)

(73) Assignee: Nimble Storage, Inc., San Jose, CA (US)

( * ) Notice: Subject to any disclaimer, the term of this patent is extended or adjusted under 35 U.S.C. 154(b) by 0 days.

(21) Appl. No.: 14/623,731

(22) Filed: Feb. 17, 2015

(51) Int. Cl.
*G06F 12/00* (2006.01)
*G06F 3/06* (2006.01)
*G06F 12/02* (2006.01)
*G11C 7/10* (2006.01)
*G06F 12/08* (2016.01)

(52) U.S. Cl.
CPC .......... *G06F 3/0613* (2013.01); *G06F 3/0617* (2013.01); *G06F 3/0655* (2013.01); *G06F 3/0685* (2013.01); *G06F 12/0246* (2013.01); *G06F 12/0833* (2013.01); *G11C 7/1072* (2013.01); *G06F 2212/2228* (2013.01); *G06F 2212/62* (2013.01)

(58) Field of Classification Search
CPC .................... G06F 12/0246; G06F 2212/2022; G06F 12/0811; G06F 12/0833; G06F 3/0613; G06F 3/0685; G06F 3/0617; G06F 3/0655; G06F 12/0253; G06F 3/0652; G06F 17/30117; G06F 17/30138; G06F 12/12
USPC .......................... 711/103, 133, 135; 707/813
See application file for complete search history.

(56) References Cited

U.S. PATENT DOCUMENTS

| 8,285,918 | B2 | 10/2012 | Maheshwari | |
|---|---|---|---|---|
| 9,015,406 | B2 | 4/2015 | Maheshwari | |
| 9,043,530 | B1 * | 5/2015 | Sundaram | G06F 3/068 711/100 |
| 9,098,405 | B2 | 8/2015 | Maheshwari | |
| 2015/0199138 | A1 * | 7/2015 | Ramachandran | G06F 3/0611 711/103 |

* cited by examiner

*Primary Examiner* — Jasmine Song
(74) *Attorney, Agent, or Firm* — Martine Penilla Group, LLP

(57) ABSTRACT

Methods and systems are presented for allocating CPU cycles among processes in a storage system. One method includes operations for maintaining segments in a first memory, each segment including blocks, and for maintaining a block temperature for each block in a second memory. The first memory is a read-cache where one segment is written at a time, and each block is readable from the first memory without reading the corresponding complete segment. The block temperature is based on the frequency of access to the respective block, and a segment temperature is based on the block temperature of its blocks. Additionally, the segment with the lowest segment temperature is selected for eviction from the second memory, and blocks in the selected segment with a block temperature greater than a threshold temperature are identified. The selected segment is evicted, and a segment with the identified blocks is written to the first memory.

18 Claims, 13 Drawing Sheets

Flash includes segments and segments include blocks that may be of different size

Make clone of S₁

Block C overwritten in V₂

ACCESS-BASED EVICTION OF BLOCKS FROM SOLID STATE DRIVE CACHE MEMORY

BACKGROUND

1. Field of the Invention

The present embodiments relate to methods, systems, and programs for managing resources in a networked storage system, and more particularly, methods, systems, and computer programs for managing a cache memory.

2. Description of the Related Art

Network storage, also referred to as network storage systems or storage systems, is computer data storage connected to a computer network providing data access to heterogeneous clients. Typically network storage systems process a large amount of Input/Output (TO) requests, and high availability, speed, and reliability are desirable characteristics of network storage.

One way to provide quick access to data is by utilizing fast cache memory to store data. Since the difference in access times between a cache memory and a hard drive are significant, the overall performance of the system is highly impacted by the cache hit ratio. Therefore, it is important to provide optimal utilization of the cache memory in order to have in cache the data that is accessed most often.

What is needed is a network storage device, software, and systems that provide for optimal utilization of cache memory in order to provide a high cache hit ratio by keeping in cache the data that is accessed the most.

It is in this context that embodiments arise.

SUMMARY

The present embodiments relate to managing cache memory. Blocks of data are kept in cache memory based on the frequency of access and based on whether the blocks of data are still active, where active blocks are those blocks that contain data accessible by a host and that are not exclusively part of a snapshot. In one embodiment, the unit for storing data in the cache memory is a segment, which includes a plurality of blocks.

In several embodiments, the eviction determination is based on a combination of methods depending on how much memory is available in a RAM memory to keep track of the information regarding frequency of access to the independent blocks. For example, some methods include tracking access to each individual block, while other methods keep track of the overall activity of the segment. Further yet, other segments may utilize other queuing methods, such as first-in first-out (FIFO).

In one embodiment, a heat map is used to track activity for each segment and for each block, and also to quickly locate each block within a segment. Each block in the heat map is associated with a block temperature number that increases with accesses to that block. Garbage Collection (GC) for the cache memory uses the heat map data to identify which segment will be evicted and which blocks from the segment being evicted will be kept in cache memory.

In one embodiment, the cache memory is a solid state drive (SSD) memory, also referred to herein as a flash cache. The flash cache is a read-cache memory where one segment is written at a time, and each block is readable from the flash cache without having to read the corresponding complete segment.

When a segment is evicted, the blocks that are being kept in flash cache from that segment are copied forward, meaning that the blocks are copied into a new segment, which is then added to the flash cache. The result is a flash cache memory that is more efficient than a cache memory using other methods such as FIFO, because FIFO does not take into account which blocks are accessed more often. By keeping in cache memory blocks that are likely to be accessed, the cache hit ratio improves, thereby improving the overall performance of the data storage system.

It should be appreciated that the present embodiments can be implemented in numerous ways, such as a method, an apparatus, a system, a device, or a computer program on a computer readable medium. Several embodiments are described below.

In one embodiment, a method includes operations for maintaining, in a first memory, a plurality of segments, each segment including a plurality of blocks, and for maintaining, in a second memory, a block temperature for each of a plurality of blocks. The first memory is a read-cache memory where one segment is written at a time, and each block is readable from the first memory without reading the corresponding complete segment. The block temperature is based on a frequency of access to the respective block, and a segment temperature for each segment is based on the block temperature for the corresponding plurality of blocks within the segment. Additionally, the method includes operations for selecting a segment from a plurality of segments with the lowest segment temperature for eviction from the second memory, and for identifying blocks in the selected segment with a block temperature greater than a threshold temperature. Further, the method includes operations for evicting the selected segment from the first memory, and for writing to the first memory a new segment having the identified blocks.

In another embodiment, a system includes a first memory, a second memory, and a processor. The first memory is for storing a plurality of segments, each segment including a plurality of blocks, where the first memory is a read-cache memory where one segment is written at a time, and each block is readable from the first memory without reading the corresponding complete segment. The second memory is for storing a block temperature for each of the plurality of blocks, each block temperature being based on a frequency of access to the respective block, where a segment temperature for each segment is based on the block temperature for the corresponding plurality of blocks within the segment. Further, the processor is operable to select a segment from a plurality of segments with a lowest segment temperature for eviction from the second memory, wherein the processor identifies identifying blocks in the selected segment with a block temperature greater than a threshold temperature, wherein the selected segment is evicted from the first memory and a new segment having the identified blocks is written to the first memory.

In yet another embodiment, a non-transitory computer-readable storage medium storing a computer program is presented. The computer-readable storage medium includes program instructions for maintaining, in a first memory, a plurality of segments, each segment including a plurality of blocks, and maintaining, in a second memory, a block temperature for each of a plurality of blocks, where the first memory is a read-cache memory where one segment is written at a time, where each block is readable from the first memory without reading the corresponding complete segment, each block temperature being based on a frequency of access to the respective block, where a segment temperature for each segment is based on the block temperature for the corresponding plurality of blocks within the segment. Further, the storage medium includes program instructions for selecting a segment from a plurality of segments with a lowest segment temperature for eviction from the second memory, and program instructions for identifying blocks in the selected segment with a block temperature greater than a threshold temperature. In addition, the storage medium includes program instructions for evicting the selected segment from the first memory, and program instructions for writing to the first memory a new segment having the identified blocks.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe methods, devices, systems, and computer programs for managing the contents of a flash cache memory, also referred to herein as a read-cache memory. In some embodiments, a heat map is maintained for blocks of data stored in the cache memory. The heat memory keeps track of the "temperature" of each of the blocks, where the temperature measures how frequently the block is being accessed. Based on the temperature, a group of blocks, referred to herein as a segment, is evicted from the flash cache, but some of the blocks of the segment may be kept in the flash cache by being rewritten into the cache memory in a new segment. This eviction method is referred to herein as Access-Based Eviction (ABE), and rewriting blocks into cache is referred to herein as copying forward these blocks.

In some implementations, a first-in first-out (FIFO) scheme is used for evicting segments from cache memory, but in the FIFO scheme, good blocks are "thrown away" together with blocks that are not being accessed.

Cache pinning of volumes is the ability to always keep the active blocks of a volume in the cache. The heat map together with the copying forward of blocks provides the ability to pin blocks to the cache, by copying forward these blocks when the segment they reside in is evicted from cache memory.

It will be apparent, that the present embodiments may be practiced without some or all of these specific details. In other instances, well-known process operations have not been described in detail in order not to unnecessarily obscure the present embodiments.

Figure 1:
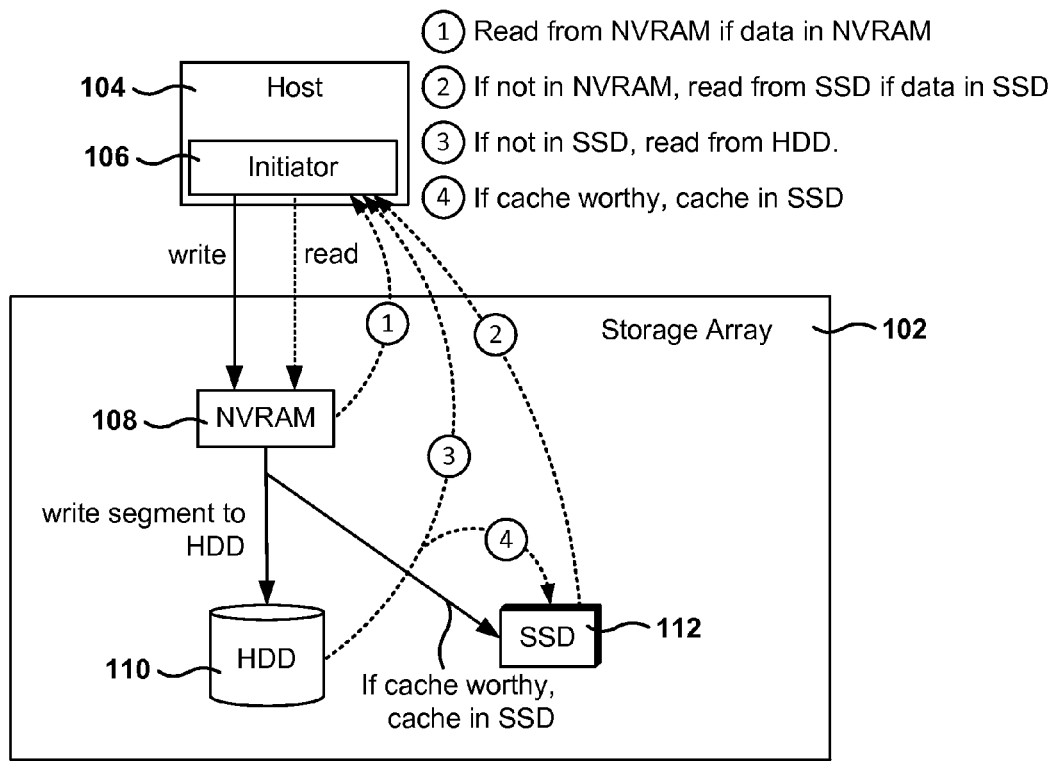
FIG. 1 illustrates the read and write paths within the storage array, according to one embodiment.

FIG. 1 illustrates the read and write paths within the storage array 102, according to one embodiment. The storage array 102 is also referred to herein as a networked storage device or a storage system. In the example architecture of FIG. 1, a storage array 102 provides storage services to one or more servers 104 (which are referred to herein as hosts) and to one or more clients (not shown). Storage array 102 includes non-volatile RAM (NVRAM) 108, one or more hard disk drives (HDD) 110, and one or more solid state drives (SSD) 112, also referred to herein as flash cache.

NVRAM 108 stores the incoming data as the data arrives to the storage array. After the data is processed (e.g., compressed and organized in segments (e.g., coalesced)), the data is transferred from the NVRAM 108 to HDD 110, or to SSD 112, or to both.

The host 104 includes one or more applications and a computer program named initiator 106 that provides an interface for accessing storage array 102 to the applications running in host 104. When an IO operation is requested by one of the applications, initiator 106 establishes a connection with storage array 102 in one of the supported formats (e.g., iSCSI, Fibre Channel, or any other protocol).

Regarding the write path, the initiator 106 in the host 104 sends the write request to the storage array 102. As the write data comes in, the write data is written into NVRAM 108, and an acknowledgment is sent back to the initiator 106 (e.g., the host or application making the request). In one embodiment, storage array 102 supports variable block sizes. Data blocks in the NVRAM 108 are grouped together to form a segment. In one embodiment, the segment is compressed and then written to HDD 110.

In addition, if the segment is considered to be cacheworthy (e.g., important enough to be cached or likely to be accessed again) the segment is also written to the SSD 112. In one embodiment, the segment is written to the SSD 112 in parallel while the segment is written to HDD 110.

With regards to the read path, the initiator 106 sends a read request to storage array 102. The requested data may be found in any of the different levels of storage mediums of the storage array 102. First, a check is made to see if the data is found in the NVRAM 108, and if the data is found in the NVRAM 108 then the data is read from the NVRAM 108 and sent back to the initiator 106. In one embodiment, a shadow RAM memory (not shown) (e.g., DRAM) keeps a copy of the data in the NVRAM and the read operations are served from the shadow RAM memory. When data is written to the NVRAM, the data is also written to the shadow RAM so the read operations can be served from the shadow RAM leaving the NVRAM free for processing write operations.

If the data is not found in the NVRAM 108 (or the shadow RAM) then a check is made to determine if the data is in SSD 112, and if so (i.e., a cache hit), the data is read from the SSD 112 and sent to the initiator 106. If the data is not found in the NVRAM 108 nor in the SSD 112, then the data is read from the hard drives 110 and sent to initiator 106. In addition, if the data being served from hard disk 110 is cache worthy, then the data is also cached in the SSD 112.

Figure 2:
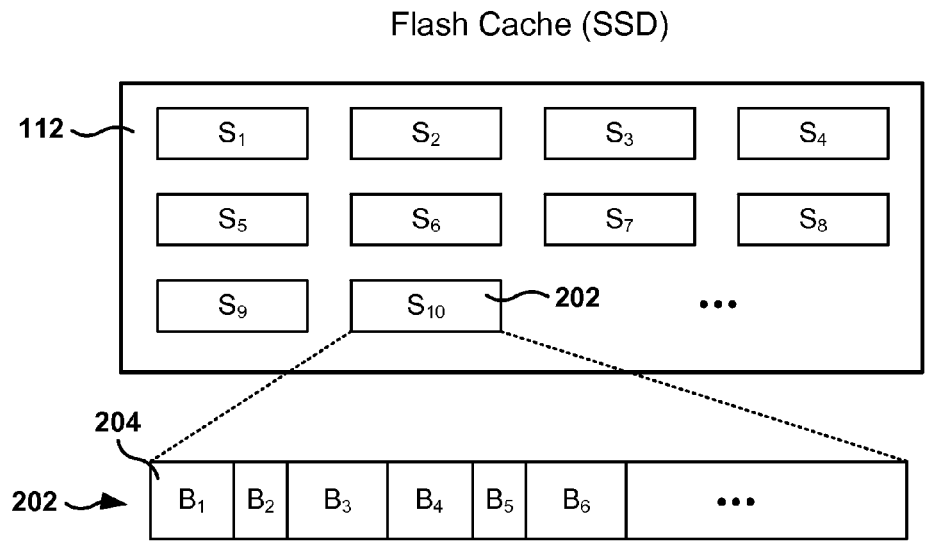
FIG. 2 illustrates the structure of a flash cache using a solid state drive (SSD), according to one embodiment.

FIG. 2 illustrates the structure of a flash cache using a solid state drive (SSD), according to one embodiment. In one embodiment, segments 202 are stored in the flash cache 112, where the segments have equal size. In other embodiments, the segments may have different sizes. In some embodiments, the segments may be 32 MB or 64 MB, although other values are also possible, such as 60 MB, 128 MB, 256 MB, etc. In one embodiment, the size of the flash cache may be 1 TB, although other values are also possible (e.g., in the range of 250 GB to 10 TB or more).

The segments (e.g., segment 202) include a plurality of blocks $B_i$ that may be of equal or different size. That is, a segment may have blocks of different sizes, although in some cases a segment may have blocks that all have the same size. Because of this, not all segments have necessarily the same amount of blocks. In some embodiments, the blocks may be within the range of 256 bytes to 32 kB, although other values are also possible.

In one embodiment, when writing to the flash cache 112, one segment is written at a time. An individual block may not be written in a single write operation. For example, it is not possible to overwrite in a write operation a block already stored within the flash cache. In order to overwrite a block, a whole new segment has to be written, the new segment having the new block.

Further, in one embodiment, the flash cache is a read-cache memory but the flash cache is not a write-cache memory. As described above with reference to FIG. 1, the flash cache is not a write cache because when data is stored in the storage array 102, the incoming data is not cached in the flash cache 112 without the data being written to disk 110. This means that all the data in the flash cache is stored in hard drives 110, so when a segment is evicted from the flash cache, it is not necessary to worry about preserving the data stored in the flash cache, because the data is guaranteed to be stored on disk.

Figure 3:
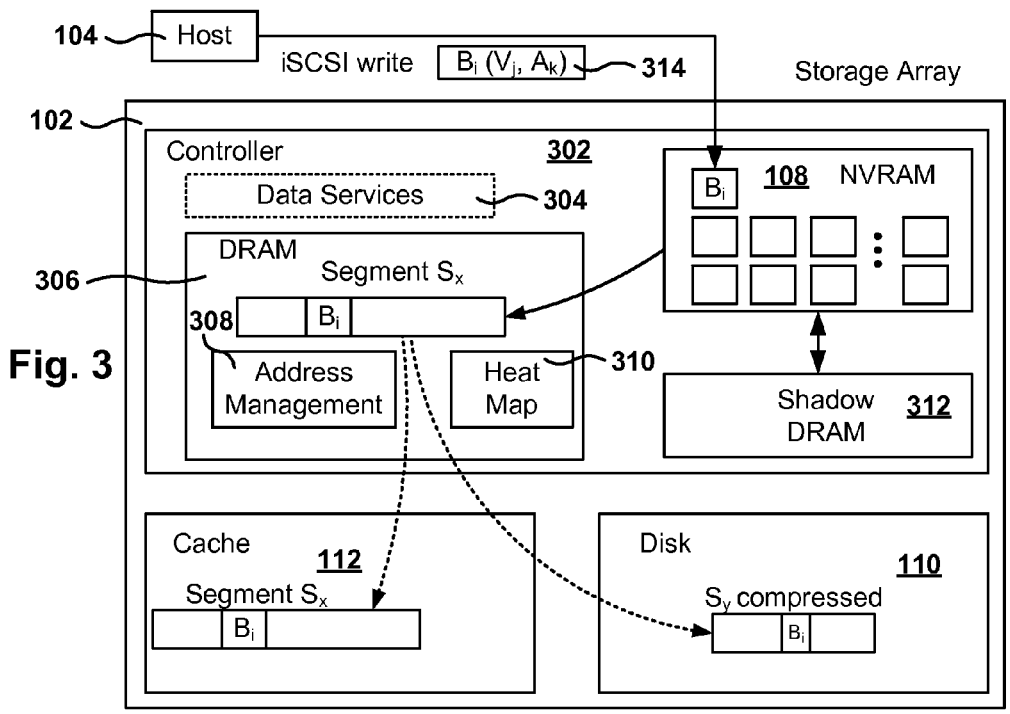
FIG. 3 illustrates the processing of a write request, according to one embodiment.

FIG. 3 illustrates the processing of a write request, according to one embodiment. In one embodiment, the host sends a write command 314 (e.g., a iSCSI write command) to write a block $B_i$ into the storage array 102. In one embodiment, the data within the storage array 102 is organized in volumes (e.g., a drive), where each volume is a single accessible storage area. The write request for block $B_i$ includes a volume identifier $V_j$ and an offset $A_k$ within the volume.

As discussed above, volume $B_i$ is initially stored in NVRAM 108. The block is then added to a segment $S_x$ in DRAM 306, and the segment $S_x$ is transferred to disk 110 and optionally to flash cache 112. In one embodiment, the segment is compressed before being sent to disk 110. In one embodiment, a shadow DRAM 312 keeps the same data as NVRAM 108, and shadow DRAM 312 is used to serve read requests.

DRAM memory 306 keeps data used for management of the storage array 102. In one embodiment, an address management area 308 is used for keeping track of the addresses of a block that may be stored in NVRAM 108, in flash cache 112, and in disk 110. Additionally, in one embodiment, a heat map 310 is kept in DRAM 306 to store data for keeping track of the frequency of access to blocks in the flash cache 112. In one embodiment, the frequency of access for each block is tracked in the heat map by a value named the block temperature. The block temperature is a number that increases each time the respective block is accessed. Additionally, the block temperature is lowered periodically, such as for example by a garbage collection program or an eviction program that periodically lowers the temperature for all blocks.

If block $B_i$ is cached in flash cache 112, the block temperature for $B_i$ is initialized in heat map 310. Further, as discussed in more detail below, a garbage collection (GC) process for the cache memory uses the heat map data to identify which segment will be evicted from cache and which blocks from the segment being evicted will be kept in cache memory. The temperature of the block is an indication on how important the block is (e.g., how often the block is accessed), and by using the temperature of the block it is possible to remove from cache the blocks that are not important, while keeping the important blocks in cache for longer periods.

Figure 4:
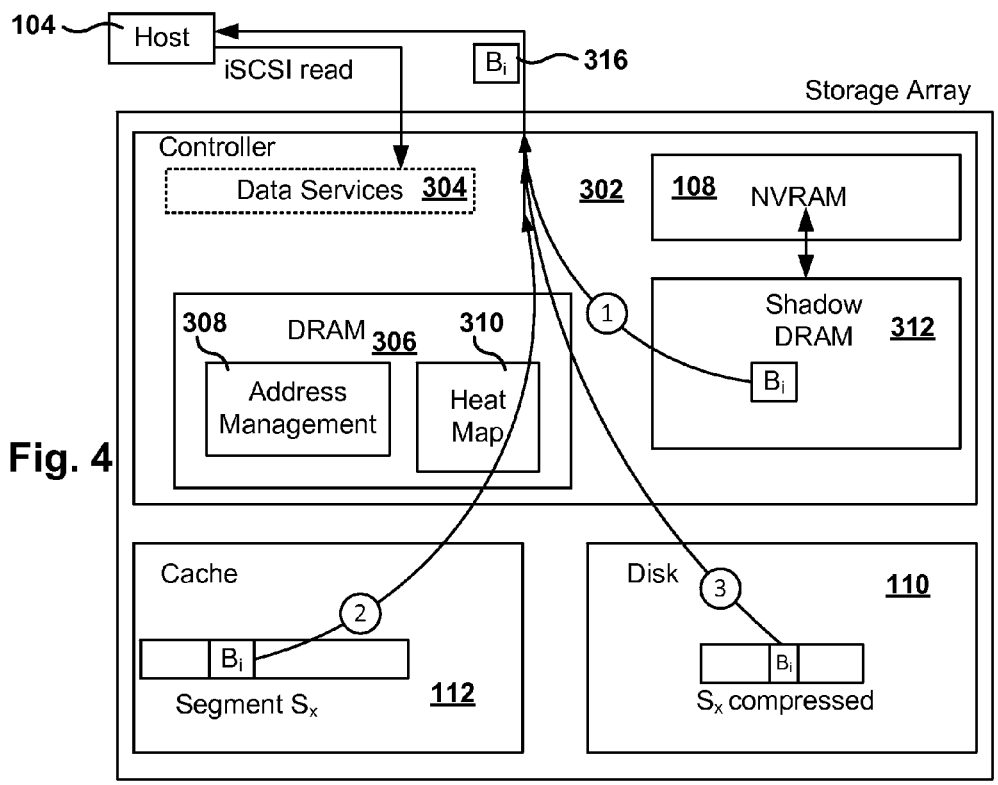
FIG. 4 illustrates the processing of a read request, according to one embodiment.

FIG. 4 illustrates the processing of a read request, according to one embodiment. As discussed above with reference to FIG. 1, when a read request for a block $B_j$ is received 316, the storage array checks to see whether the data is in NVRAM 108, DRAM 306, flash cache 112, or disk 110. Then the data is served from the faster media where the data for block $B_j$ is available.

If the block $B_j$ is served from flash cache 112, then the heat map 310 for block $B_j$ is updated to reflect the new access to block $B_j$. In one embodiment, the block temperature for block $B_j$ is increased by 1. In other embodiments, other changes to the block temperature may be utilized to reflect the new access. In another embodiment, if the block $B_j$ is in NVRAM 108, the heat map 310 for block $B_j$ is also updated to reflect the new access to block $B_j$.

In one embodiment, the block temperature is a four-bit integer, but other embodiments may utilize more or less bits to a store the block temperature. In this case, the block temperature has a value between 0 and 15. When a block is first written to cache, the block temperature is initialized to a predetermined value, such as 0, or 1, or 3, etc. Then, as the block is accessed, the block temperature is increased, up to the maximum of 15. As discussed above, the temperature may be lowered periodically to allow inactive blocks to "cool" down and become candidates for eviction.

In one embodiment, a predetermined value may be reserved for blocks that are inactive, as discussed in more detail below with reference to FIGS. 5A-5E. For example, an inactive or dead block may be given a temperature of 0, which will guarantee that the block is not kept in cache when the segment where the block resides is evicted.

In another embodiment, a predetermined value may be assigned to blocks pinned to cache. In some embodiments, the storage array administrator has an option to determine that the volume is to be pinned in cache, which means that all the blocks from the volume will be kept in cache. Further, the administrator may also reserve an amount of cache space for a volume. When a block is pinned to cache, the block is given a high temperature (e.g., 15) so the block is always kept in cache. Additionally, a pinned block may not be cooled off over time because there would be a risk that the pinned block would be evicted. In other embodiments, pinned blocks are tracked with a different parameter (e.g., a bit on the heat map) so these blocks are not evicted during garbage collection.

In one embodiment, the block temperature has the following values:

15—the block is pinned.

14—the block is very hot, meaning that the block is an active block of a non-pinned volume.

1 to 13—the temperature of the block based on access frequency.

0—the block is very cold or dead.

It is noted that the embodiments illustrated in FIGS. 3 and 4 are exemplary. Other embodiments may utilize different cache structures, different data paths, or different values to identify the frequency of access to a block (e.g., number of times accessed per minute or per hour, etc.), different values for the temperature, etc. The embodiments illustrated in FIGS. 3 and 4 should therefore not be interpreted to be exclusive or limiting, but rather exemplary or illustrative.

Figure 5A:
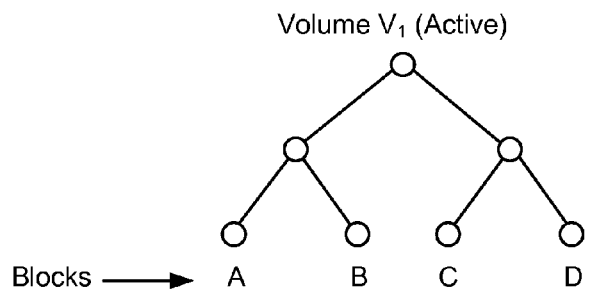
FIGS. 5A-5E illustrate the organization of blocks within a volume, according to one embodiment.

FIGS. 5A-5E illustrate the organization of blocks within a volume when different operations are performed on the volume, according to one embodiment. FIG. 5A illustrates an index, in the form of a tree map associated with a volume $V_1$, for indexing the blocks within the volume.

The storage array keeps track of the locations of blocks for all volumes in the storage array. Different methods may be used to index the different blocks, such as a heap, a tree, a vector, etc. In the exemplary embodiment of FIG. 5A, volume $V_1$ has 4 blocks: A, B, C, and D, and the index is a tree structure for identifying the location of the blocks. There is a root node at the top of the volume and two intermediate nodes with pointers to two blocks each. As used herein, this structure is referred to as the cache index, but the cache index may use any other type of data organization.

The volume $V_1$ is an active volume, which means that its blocks may be read, may be rewritten, may be erased, and that new blocks may be added. When a user requests data from the active volume $V_1$, the read request will serve one or more of the active blocks from volume $V_1$.

Figure 5B:
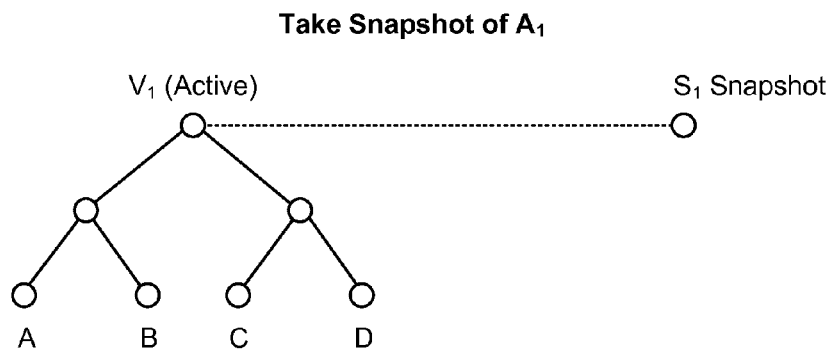

Over time, the data administrator may configure the storage array to take snapshots of volume $V_1$ (e.g., periodically or upon command), as illustrated in FIG. 5B. When a snapshot $S_1$ of volume is created a new data structure is created for the snapshot. However, the blocks are not copied and the index for the snapshot utilizes all or part of the index for the volume $V_1$. In FIG. 5B all the blocks of snapshot $S_1$ are equal to the blocks of volume $V_1$. Therefore, the index for $S_1$ includes a pointer to the root of volume $V_1$. In general, snapshots are read only, although in some cases small amounts of data may be written in the snapshot for some embodiments.

Figure 5C:
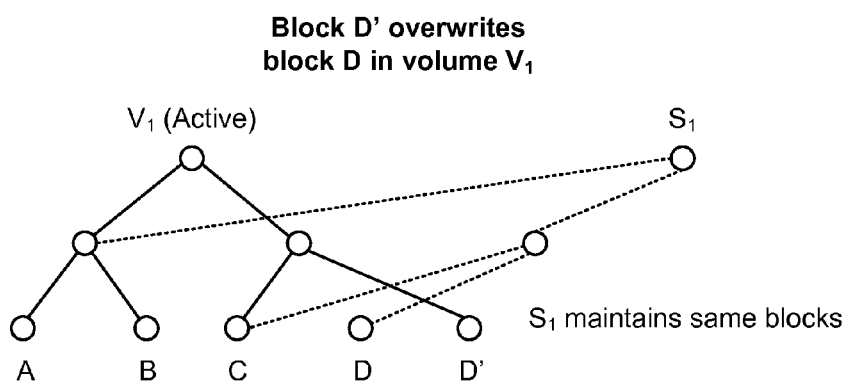

FIG. 5C illustrates the changes in the indexes when blocks are overwritten in volume $V_1$. In this case, $V_1$ has performed an operation to replace block D with D'. Since D is no longer part of $V_1$, one intermediate node of $V_1$ now points to blocks C and D'.

Additionally, snapshot $S_1$ still has the same blocks A, B, C, and D. The index for $S_1$ is modified to reflect the changes in the index of $V_1$. The root of $S_1$ now points to the same intermediate node for blocks A and B, and to a newly created intermediate node pointing to the original blocks C and D. Therefore, $V_1$ and $S_1$ share an intermediate node corresponding to blocks A and B, but do not share the intermediate nodes for blocks C, D, and D'.

As used herein, the index that contains the active blocks of the volume is referred to as the tip of the volume, or tip of the drive. Additionally, blocks that cannot be accessed from a host are referred to as dead blocks. On the other hand, the blocks that are accessible from a host are live blocks. The live blocks can be snapshot-only blocks or active blocks. The snapshot-only blocks are blocks that can be accessed only in a snapshot but not within an active volume. Active blocks are those blocks that can be accessed in the active state of a volume, i.e., the tip of the volume. As used herein an inactive block is a block that is not an active block.

Further yet, active blocks can be cold, hot, or pinned. Cold blocks are those that are not accessed frequently, hot blocks are those that are accessed frequently, and pinned blocks are those blogs that belong to a volume designated by the user as a pinned volume.

In one embodiment, when a block from flash cache is overwritten (e.g., block D), the temperature of the block is immediately lowered so the block will be evicted when the segment is evicted from memory. In other words, the block will not be copied forward, i.e., the block will not be added to another segment for being rewritten to the cache. In one embodiment, the temperature for the overwritten block is set to 0, but other values are also possible.

Figure 5D:
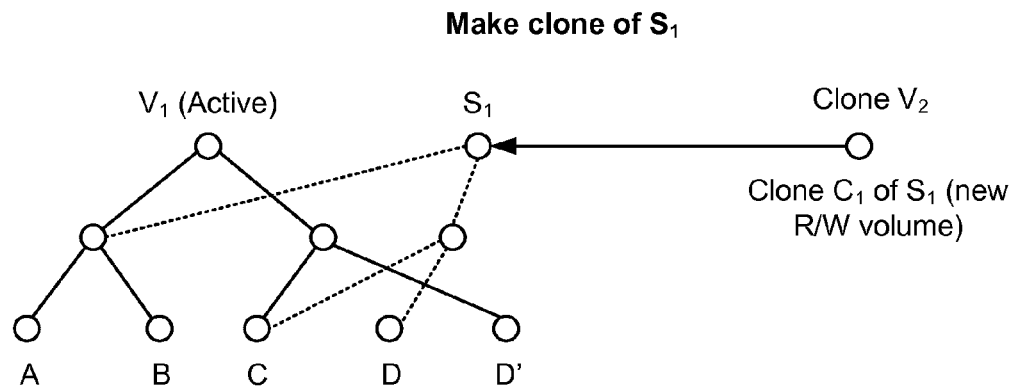

FIG. 5D illustrates the creation of a clone $V_2$ based on snapshot $S_1$. The clone $V_2$ is a read/write volume and the historic snapshots are shared with the parent snapshot and volume. When the clone $V_2$ is created, the root of the index for the clone is a pointer to the root of $S_1$.

Figure 5E:
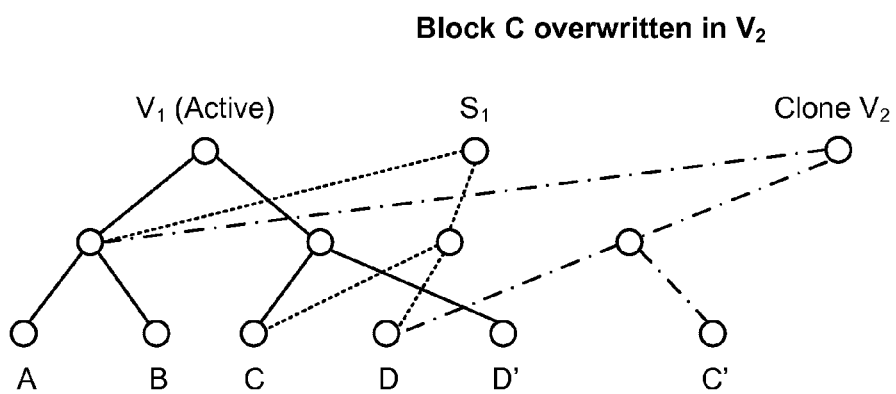

FIG. 5E illustrates the changes to the $V_1$ index when block C is overwritten in volume $V_2$ and the reconstruction of $V_2$'s index. The root of $V_2$ points to a first intermediate node for blocks A and B, and to a new second intermediate block for blocks C' and D.

In general, blocks may be inactivated in three ways. First, when new blocks overwrite all blocks (as discussed above in FIGS. 5C and 5E), the overwritten blocks become inactive. This is the most common cause of block inactivations. Second, during block migrations. In the storage system, blocks, or groups of blocks, are sometimes transferred from one storage array to another storage array. After the blocks are migrated, the blocks at the source need to be deleted. Third, during a volume restore or a snapshot rollback. This operation changes the tip of the volume from the current state to a snapshot. Since the tip changes, the list of active blocks that represent the volume also changes and the heat map needs to be updated.

In one embodiment, in order to have an efficient cache, the blocks that are still active should remain in the cache, and the inactive blocks should be discarded. When blocks are marked dead or inactive, the blocks are not removed from cache right away because it is an expensive operation to remove a block from cache. Instead, the dead or inactive blocks are removed from the flash cache when it is convenient or necessary, such as when a segment is being evicted from cache.

Figure 6:
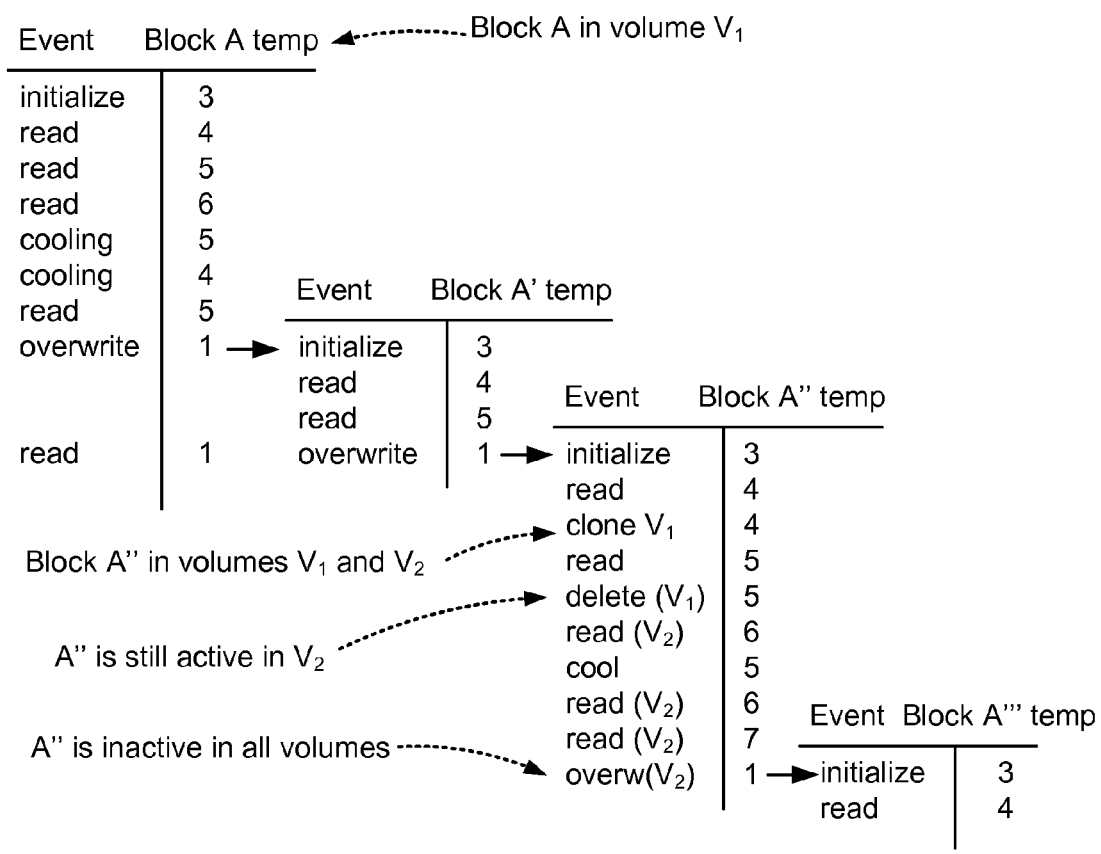
FIG. 6 illustrates the evolution of the temperature of a block over time based on events, according to one embodiment.

FIG. 6 illustrates the evolution of the temperature of a block over time based on events, according to one embodiment. In one embodiment, the temperature of the block increases when a block is accessed and the temperature decreases periodically. In one embodiment, a process executes periodically that decreases the temperature of all blocks whose temperature is greater than 0.

Additionally, the temperature of a block may be reset to a predetermined value (e.g., 1 although other values are also possible), associated with very low heat, when the block is inactivated. By setting the temperature to 1, there is an opportunity for backup software to access this block before it is completely eliminated from cache. Similarly, when inactivating a block from a non-pinned volume, its temperature is also set to 1 (very low heat), for the same reason.

In the exemplary illustration of FIG. 6, the temperature of a block A is tracked over time. When the block is first written into cache, the temperature is initialized to a predetermined value (e.g. 3, although other values are also possible). Afterwards, the block is read three times, and each time the temperature of the block is increased. Afterwards, there is a period of inactivity and the block is cooled off (i.e., the temperature is decreased) two times. Then the block is accessed once again and the temperature is increased to a value of 5.

Afterwards, block A is overwritten by block A'. The temperature of block A is reset to 1 because the block is no longer active. The temperature of block A' is initialized and then the temperature is increased two times after the block A' is accessed twice. Afterwards, block A' is overwritten by block A". The temperature of block A' is set to 1 and the temperature of block A" is initialized to 3.

The temperature of A" is increased when the block is accessed and then a clone $V_2$ of volume $V_1$ is created. Therefore, block A" is now active in volumes $V_1$ and $V_2$. Later, when block A" is deleted in volume $V_1$, the temperature is not reset because A" is still active in volume $V_2$.

Then the temperature of A" continues to increase or decrease based on access or cooling periods until A" is overwritten in volume $V_2$ by A'". Since A" is now inactive in all volumes, the temperature of A" is reset to 1.

Figure 7:
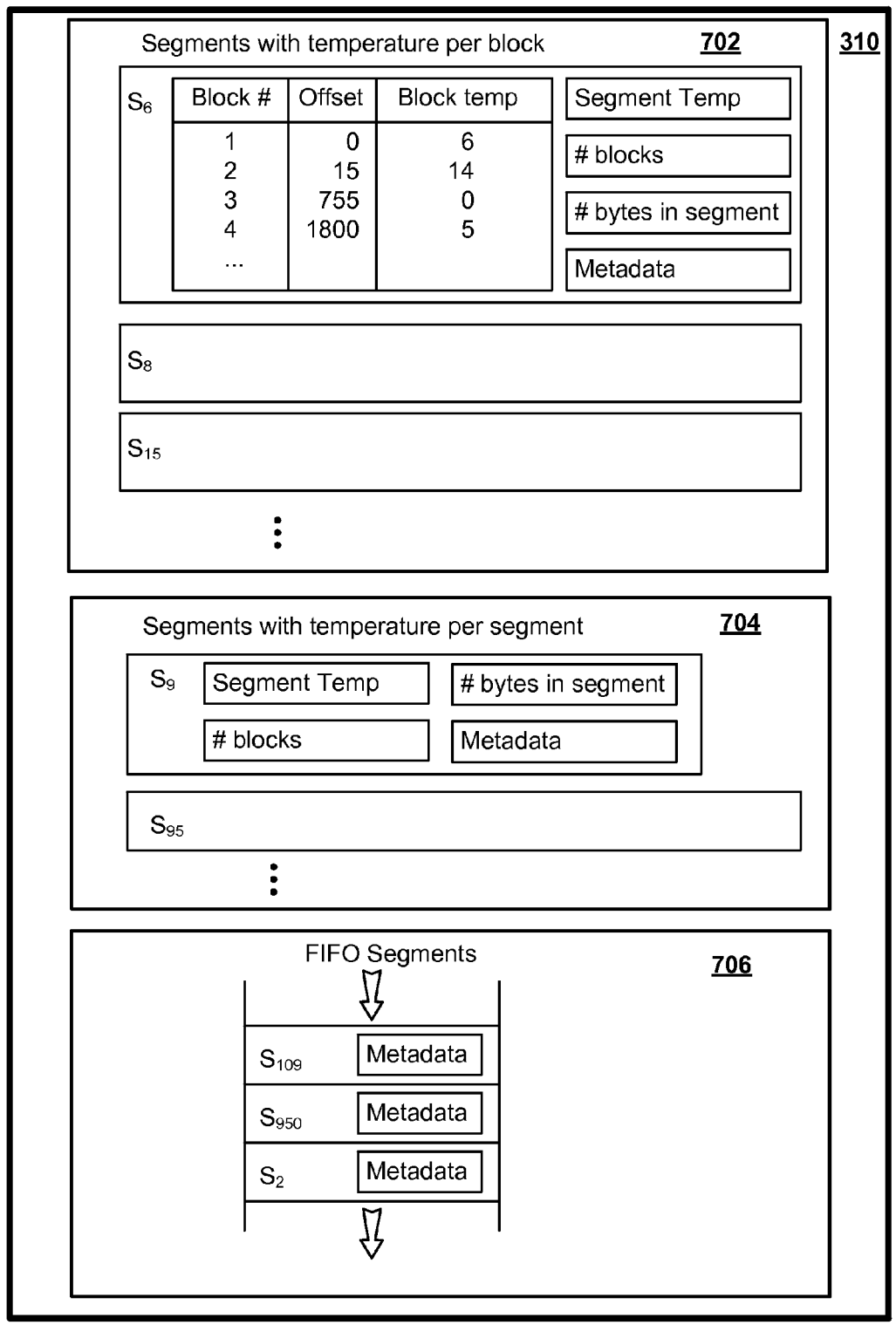
FIG. 7 illustrates the structure of a heat map stored in RAM for tracking the temperature of blocks and segments within a cache memory, according to one embodiment.

FIG. 7 illustrates the structure of a heat map stored in memory for tracking the temperature of blocks and segments within a cache memory, according to one embodiment. The heat map is also referred to herein as a segment activity table. In one embodiment, the heat map is used to store information about the frequency of access to blocks in the cache.

The information in the heat map is used by the garbage collection (GC) process to find segments for eviction from cache, and to copy forward blocks to the cache. In one embodiment, the heat map is stored in RAM memory for quick access and is sporadically flushed to disk for persistence.

In one embodiment, there are three ways of tracking segments in cache. A first group of segments 702 are tracked by keeping the temperature for each of the blocks in the segment. A second group of segments 704 are tracked by keeping a segment temperature value for each segment, without keeping track of the block temperatures. Finally, a third group of segments 706 do not use temperature information and use a FIFO method for evicting segments from cache.

Regarding segments with temperature per block 702, a table provides information about each block in the segment, including the block ordinal number, the offset of the block within the segment, and the block temperature. Additionally, other data kept for each segment includes the segment temperature, the number of blocks in the segment, the number of bytes written in the segment, and segment metadata having additional segment-related information, such as the segment identifier, version identifier, etc. In one embodiment, these parameters are kept in one data structure, but in other embodiments, the parameters may be stored in separate data structures (e.g., the segment temperature is kept in a different table than the segment temperature).

In one embodiment, the block temperature is kept in a four-bit variable, as discussed above, but more or less storage may be used to track block temperature. In one embodiment, the number of blocks in the segment is variable because the blocks may have different sizes. In addition, the number of blocks may also vary due to compression of the blocks before being stored. In one embodiment, a variable-size record is kept per segment to accommodate the variability in the number of blocks.

The ordinal number, also referred to herein as the block number, is a number assigned to each block that identifies the position of the block within the segment. For example, the block numbers may be 1, 2, 3, 4, etc.

In one embodiment, a block is identified in memory by pair of values: the segment ID, and the offset of the block within the segment. When a read request comes with this pair of values, the system reads the corresponding segment, starting at the provided offset. However, it is not possible from the offset to identify the ordinal number of the block within the segment, because blocks have variable sizes. Since the block number is not known, it would not be possible to update the block temperature. In order to avoid this problem, an offset value is kept per block in the DRAM memory, so when a request for a block comes in, it is possible to quickly identify the block number from the offset of the block, and operations on the block temperature are possible and fast.

In one embodiment, the temperature of the segment is calculated according to the following equation:

$$\text{segment temperature} = (\#\text{blocks with } T_i > K) \times \left(\frac{\#\text{bytes written to segment}}{\#\text{blocks in segment}}\right) \quad (1)$$

Where #blocks is the number of blocks, #bytes is the number of bytes, $T_i$ is the temperature of block i, and K is a threshold temperature value (e.g., in the range of 4-10, although other values are also possible).

For example, if there is a segment with 10 blocks with an equal size of 4 kB, one block has a temperature above the threshold temperature K, and 9 blocks have a temperature below K, then the segment temperature will be equal to (1 block with Ti>K)×(40K bytes written to segment/10 blocks in segment)=4 KB.

Once a volume is marked as pinned by the storage administrator, there are two possible approaches to populate the data of the volume into the cache: proactive scan and caching on-the-fly. In the proactive scan, the system scans the volume for active blocks and the blocks that are not already cached are then cached. In addition, in one embodiment, these blocks are marked as pinned in the heat map.

In the caching on-the-fly method, the blocks are cached when the volume receives new writes or when there is a cache miss on a block read. Therefore, all writes to the volume after the volume is marked as pinned will be cached and pinned. Even though initially not all the blocks are cached, eventually all the blocks of the volume will be cached.

In some extreme cases, it is possible that there is not enough space in DRAM to keep the block temperature for each block, which may be happen when a large number of blocks are in cache due to compression or due to the existence of many small blocks. In these cases, it is possible to keep segments with a segment temperature value per segment 704 instead, without keeping track of the individual block temperatures.

In one embodiment, the segment temperature, for segments without a block temperature, is equal to the number of active bytes in the segment. When garbage collection is performed, the segment temperature will be used to determine if the segment is evicted or not, but copying forward of blocks will not be available for these segments because there is no block temperature available. This segment temperature is valuable because the segment that will be chosen will have the least amount of active bytes. It is an objective of garbage collection to evict segments with the least amount of active bytes in order to "clean" as many inactive bytes as possible from the cache in each eviction.

There can be times when temperature information is not available. For example, if the system just rebooted. At that point, it is possible to use a FIFO method for cache eviction, which is based on the age of the segments in the cache. In this case, the segment that has been the longest time in the cache will be evicted first.

In addition, there could be situations where FIFO may be more efficient for certain volumes, and then it is possible to utilize FIFO for those volumes while using heat for the other volumes. This means that the system supports segments with different types of heat maps.

For the purpose of garbage collection, described in more detail below with reference to FIG. 8, the FIFO segments are assigned a temperature of zero, so FIFO segments will be evicted first, and as long as there are FIFO segments, the segments with a temperature greater than zero will remain in cache.

In one embodiment, the storage array provides an option to system administrators for selecting which type of segment eviction method to use for a given volume: using block temperatures, using a segment temperature, or using FIFO.

It is noted that the embodiments illustrated in FIG. 7 are exemplary. Other embodiments may utilize different data values, organize the data in a different form, include additional values, or omit some of the values. The embodiments illustrated in FIG. 7 should therefore not be interpreted to be exclusive or limiting, but rather exemplary or illustrative.

Figure 8:
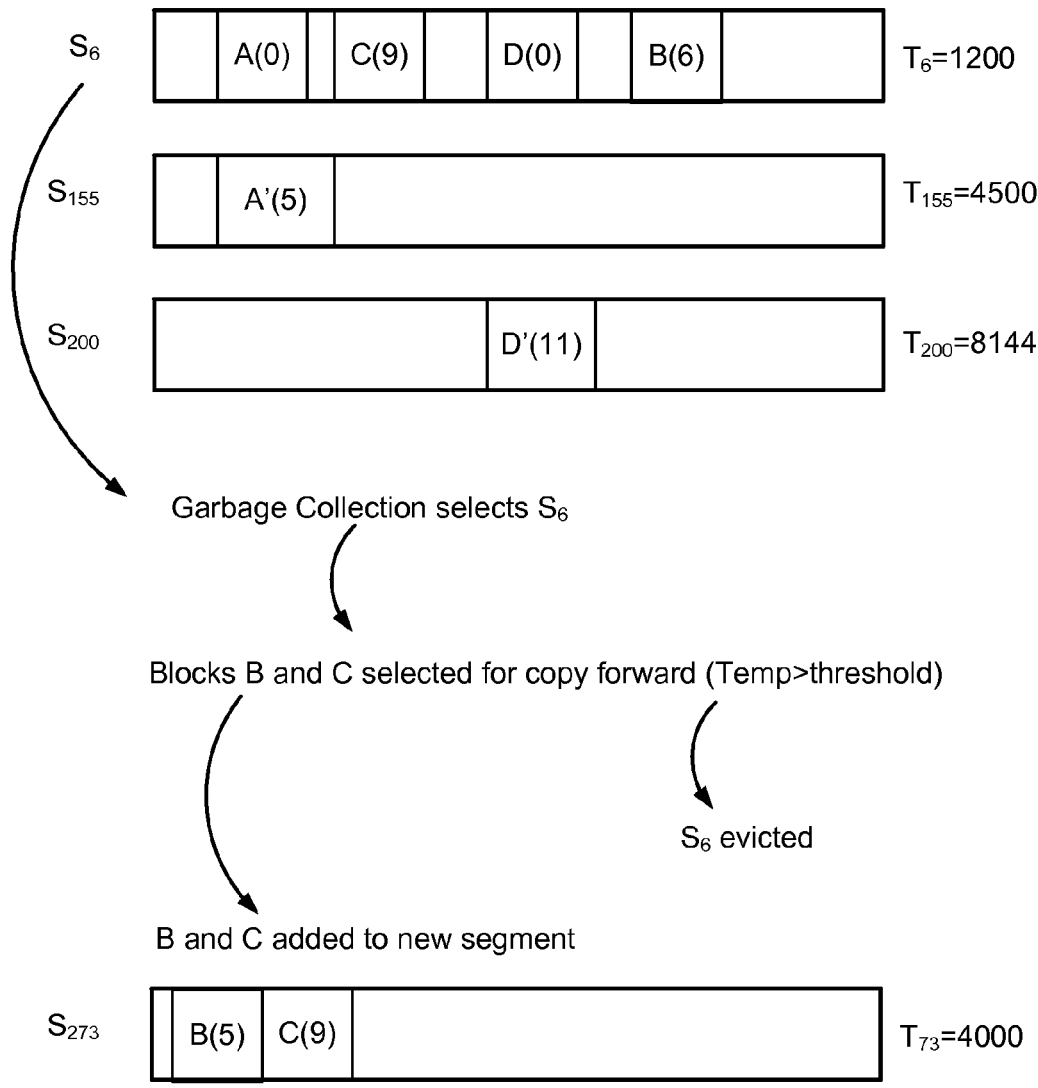
FIG. 8 illustrates the copy forward of blocks in a flash cache during garbage collection, according to one embodiment.

FIG. 8 illustrates the copy forward of blocks in a flash cache during garbage collection, according to one embodiment. It is one goal of garbage collection to pick the segments that have a small amount of data to be copied forward, otherwise GC would have to be run very often.

In one embodiment, garbage collection selects the segment from cache having the lowest temperature. As discussed above with reference to FIG. 7, some segments have a temperature that is based on the temperature of blocks within the segments, or the segments have a temperature based on the number of active bytes in the segment, and segments using FIFO for eviction have a temperature of zero.

Once the segment is selected for eviction, if a block temperature is available then the blocks with a temperature above a threshold temperature will be copied forward to cache. Copying forward a block means adding the block to a new segment, together with other blocks that are waiting to be cached, and then caching the new segment.

In the example of FIG. 8, three segments are in cache, $S_6$, $S_{155}$, and $S_{200}$. $S_6$ has a temperature of 1200, $S_{155}$ has a temperature of 4500, and $S_{200}$ has a temperature of 8144. When garbage collection is looking for a segment to evict, $S_6$ is chosen because $S_6$ has the lowest temperature.

$S_6$ has blocks A with a temperature of 0, C with a temperature of 9, D with a temperature of 0, and B with a temperature of 6. In this exemplary embodiment, the threshold temperature is 5, therefore, blocks B and C are selected for copy forward because the temperature is greater than 5.

B and C are added to a new segment $S_{273}$ being formed in RAM and then segment $S_{273}$ is added to the cache. Since blocks B and C are active, the heat temperature for these blocks is maintained at 5 and 9, respectively. In addition, segment $S_6$ is evicted from memory by the garbage collection.

Figure 9A:
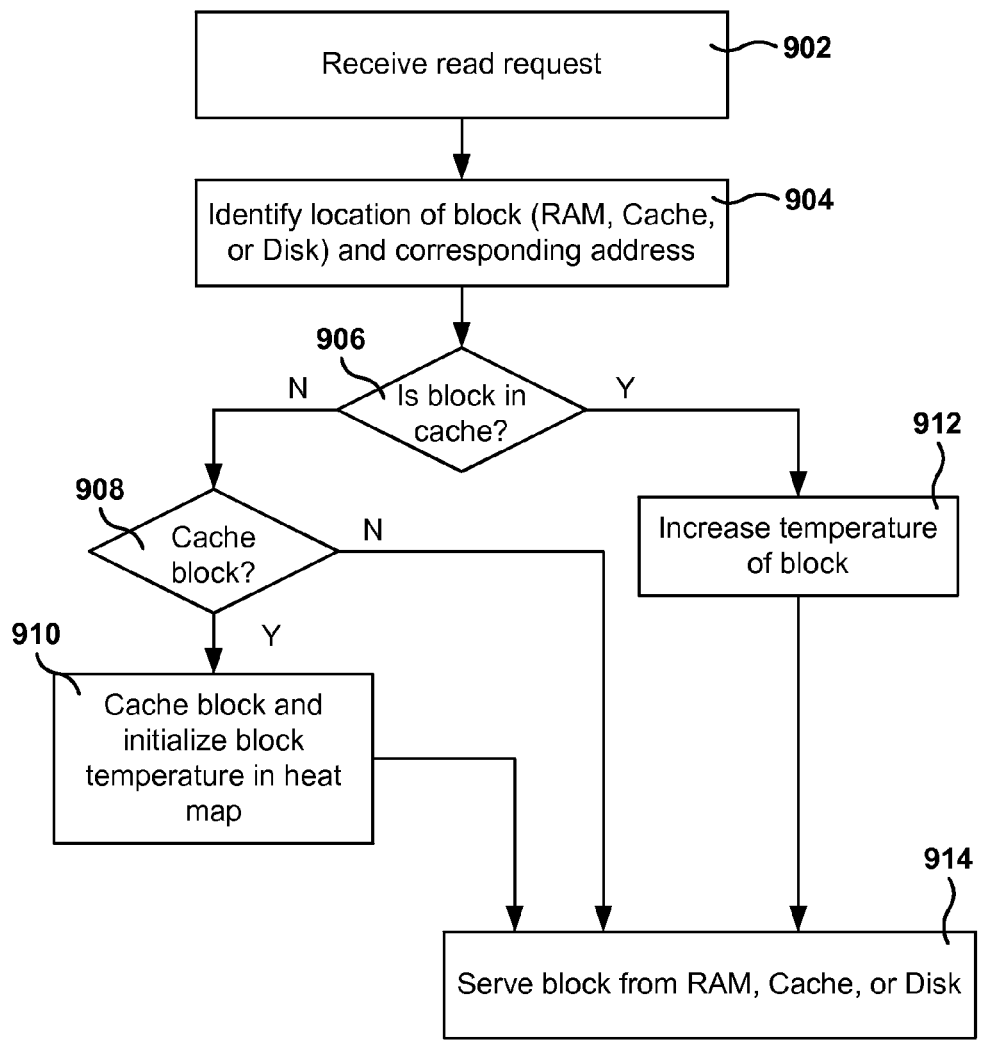
FIG. 9A is a flowchart for processing a read request, in accordance with one embodiment.

FIG. 9A is a flowchart for processing a read request, in accordance with one embodiment. While the various operations in the flowchart of FIGS. 9A-9C and 10 are presented and described sequentially, one of ordinary skill will appreciate that some or all of the operations may be executed in a different order, be combined or omitted, or be executed in parallel.

In operation 902, a read request is received by the storage array. In one embodiment, the read request includes a volume identifier, an offset, and an amount of data. From operation 102, the method flows to operation 904 where the controller identifies the location of the block of data associated with the read request. Of course, if more than one block is required to satisfy the read request, the operations described herein will be repeated for all the blocks.

The controller identifies if the block is stored in RAM, cache, or disk. In addition, the controller identifies the address of the block in the corresponding storage media. For example, if the block is in RAM, the controller identifies the RAM address of the block. If the block is in cache, the block identifies the segment and offset of the block in cache, and if the block is in disk, the block identifies the drive and location within the drive.

From operation 904, the method flows to operation 906 where a check is made to determine if the block is stored in cache. If the block is stored in cache the method flows to operation 912. If the block is not in cache the method flows to operation 908.

In operation 912, the temperature of the block is increased (unless the block temperature is already at a maximum) to reflect the new access performed to the block. From operation 912, the method flows to operation 914. In operation 908, a check is made to determine if the block should be cached in flash memory. If the block is to be cached, the method flows to operation 910, and if the block is not to be cached the method flows to operation 914.

In operation 910, the block is cached and the block temperature is initialized in the heat map. In operation 914, the block is returned to the requester from RAM, or cache, or disk.

Figure 9B:
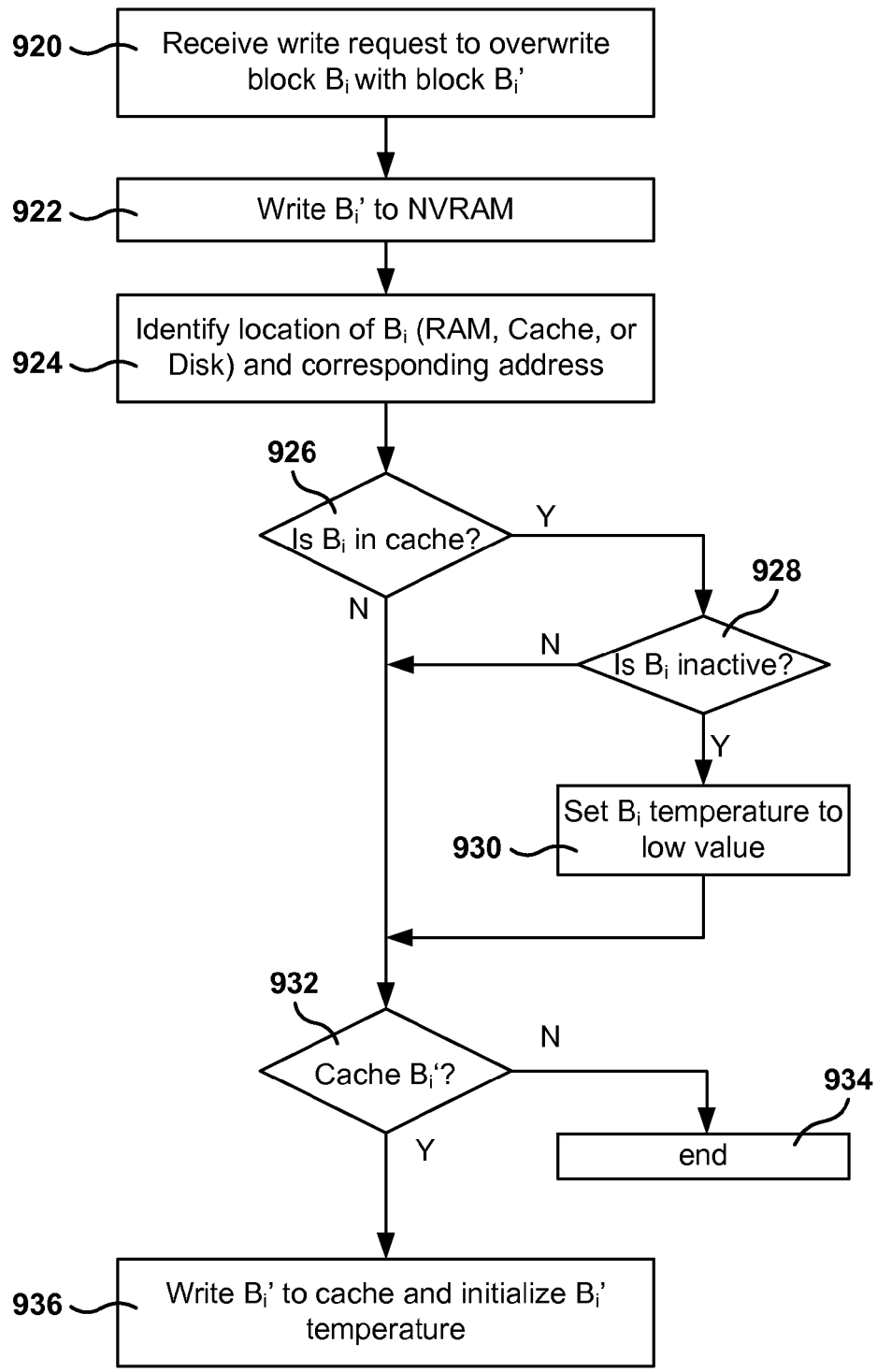
FIG. 9B is a flowchart for processing a write request, according to one embodiment.

FIG. 9B is a flowchart for processing a write request, according to one embodiment. In operation 920, the storage array receives a write request to write a block $B_i'$ that overwrites block B. In operation 922, the new block Bi' is first written to NVRAM.

From operation 922, the method flows to operation 924 where the storage array identifies the location of the block $B_i$ being overwritten. The location may be in RAM, cache or disk. From operation 924, the method flows to operation 926 where a check is made to determine if block $B_i$ is in cache. If $B_i$ is in cache the method flows to operation 128, but if $B_i$ is not in cache the method flows to operation 932.

In operation 928, a check is made to determine if block $B_i$ is now inactive. For example, if block $B_i$ is active only in the volume from which $B_i$ is being overwritten, then $B_i$ will become inactive due to the overwrite operation. However, if block $B_i$ is still active (e.g., because the block is still active in another clone), the overwrite operation will not change the block temperature in operation 930. However, if the block is not inactive (i.e., the block is active) then the method flows to operation 932.

In operation 932, the controller determines if the new block $B_i'$ is cache worthy, i.e., if the block is going to be cached. If the block $B_i'$ is cache worthy, $B_i'$ is written to cache and the heat map for $B_i'$ is initialized. If $B_i'$ is not to be cached, the write request ends 934. Of course, there may be other additional operations taking place unrelated to the heat map, such as sending the data back to the requester, which are not shown in the flowchart.

Figure 9C:
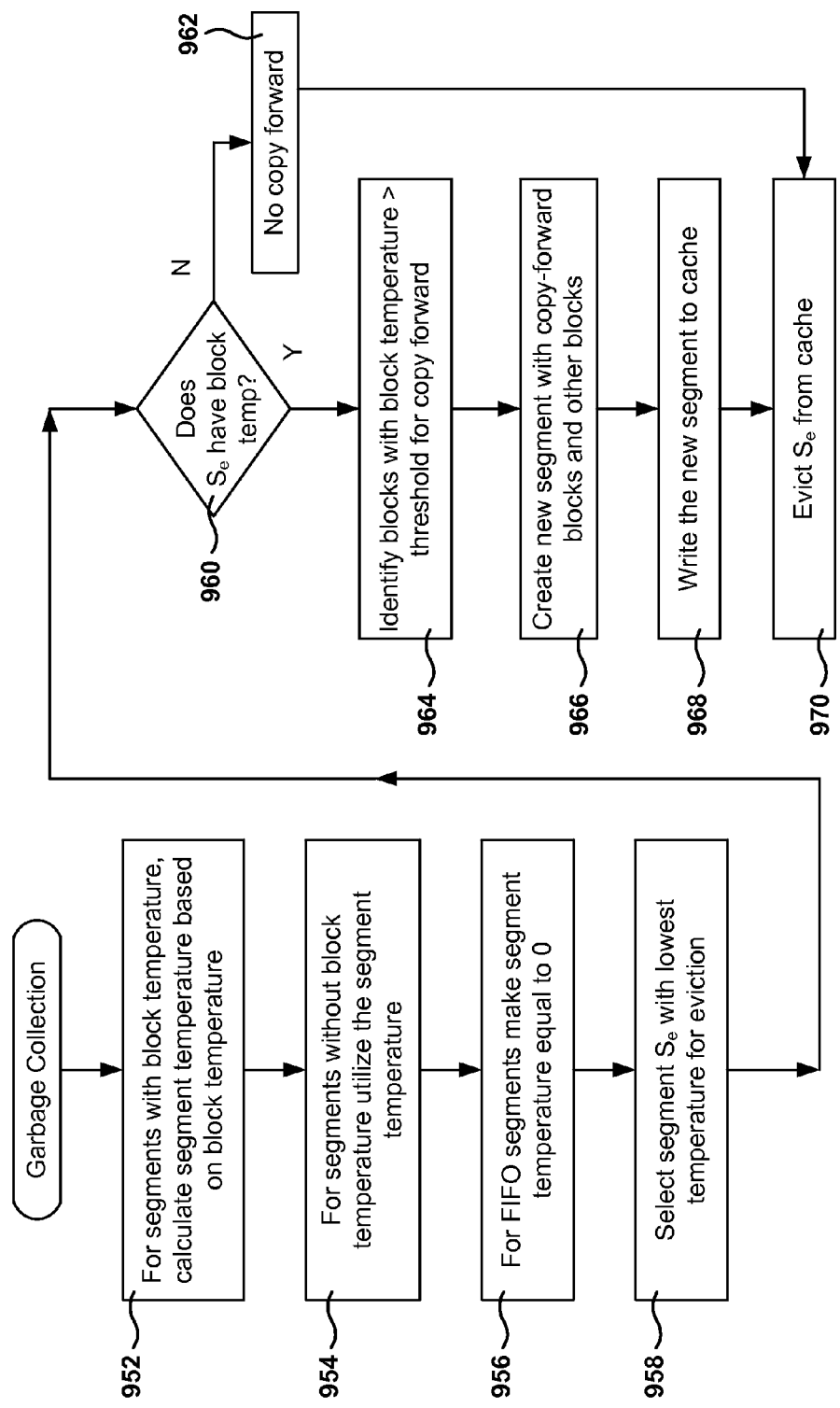
FIG. 9C is a flowchart for garbage collection, according to one embodiment.

FIG. 9C is a flowchart for garbage collection, according to one embodiment. In operation 952, the segment temperature is calculated for those segments that track the individual block temperature within the segments. In one embodiment, the segment temperature is calculated using equation (1) described above, but other embodiments may utilize other calculations for the segment temperature based on the block temperature. In another embodiment, the segment temperature is equal to the sum of the number of bytes for blocks that have a temperature above the threshold.

From operation 952 the method flows to operation 954, where the segment temperature is determined as the number of active bytes in the block for segments that do not track the individual block temperature. From operation 954 the method flows to operation 956, where the segment temperature for segments utilizing a FIFO method for eviction is set to 0, or to some other predetermined value.

It is noted, that the garbage collection methodology allows the flexibility of utilizing different methods concurrently for different segments in order to determine which segment will be evicted. Further, the storage array is able to switch from one method to another depending on the status of the storage array. For example, at times the array may utilize the tracking of block temperature, and at other times the array may decide to just track the number of active bytes for each segment. Further yet, the array may utilize a FIFO scheme at some times for all segments, such as when the array is being initialized.

From operation 956 the method flows to operation 958, where a segment $S_e$ with the lowest segment temperature is selected for eviction from the flash cache. Depending on the type of segment, copy forward of "hot" blocks may be possible or not. If the block temperature is being tracked in the selected segment $S_e$, then it is possible to copy forward some of the blocks. However, if the individual block temperature is not being tracked in segment $S_e$ then there will be no copy forward of blocks from $S_e$.

In operation 960, a check is made to determine if segment $S_e$ is tracking temperatures of the blocks in Se. If the block temperatures are being tracked, the method flows to operation 964 but if the block temperatures are not being tracked, there is no copy forward of blocks 962.

In operation 964, the blocks with a block temperature greater than a threshold temperature are identified. From operation 964 the method flows to operation 966, where a new segment is created with the identified blocks in operation 964 and with other blocks identified by the array for caching. In operation 968, the new segment is written to cache, and in operation 970 the segment $S_e$ selected for eviction is evicted.

Figure 10:
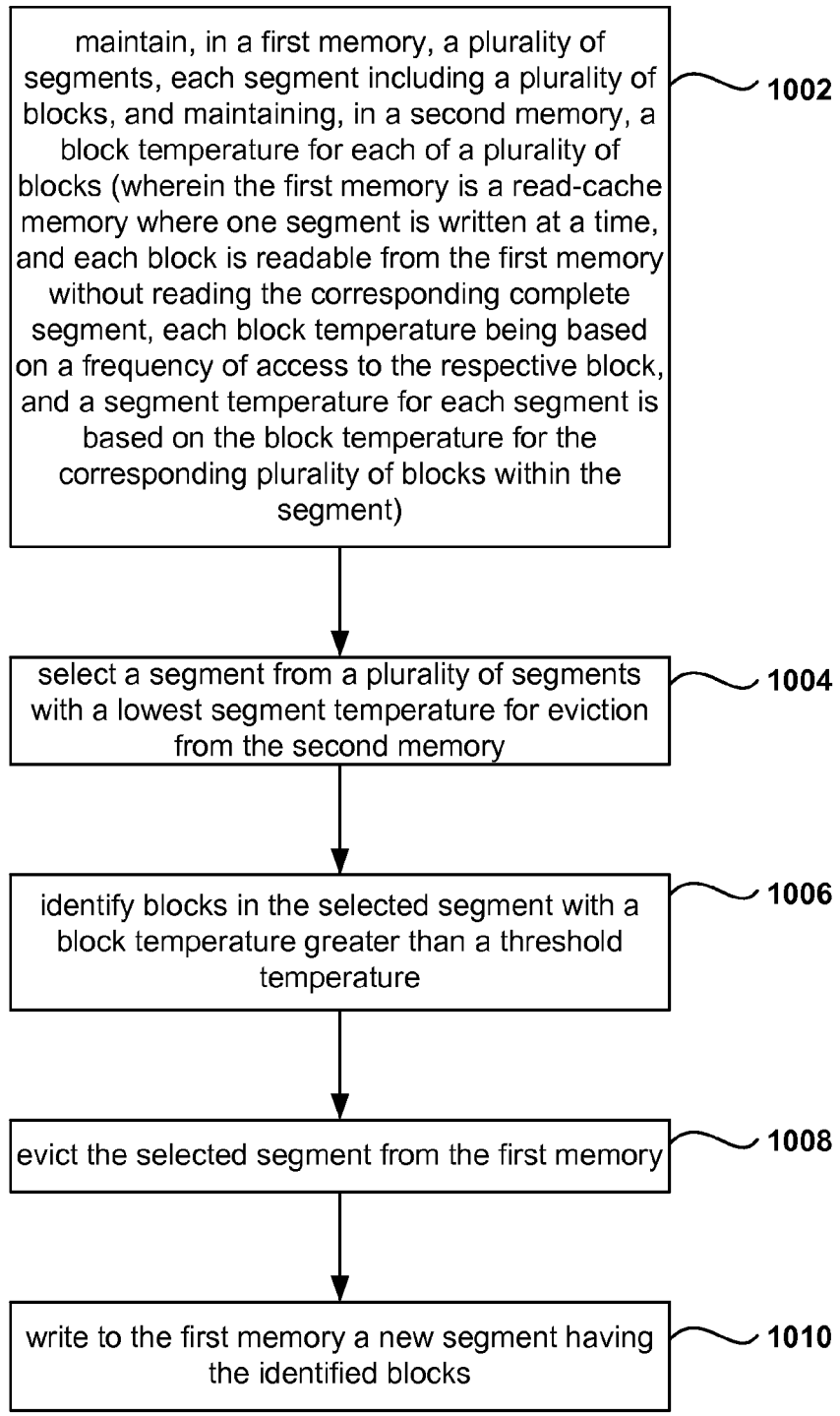
FIG. 10 is a flowchart for managing the contents of a cache memory, according to one embodiment.

FIG. 10 is a flowchart for managing the contents of a cache memory, according to one embodiment. Operation 1002 is for maintaining, in a first memory, a plurality of segments, each segment including a plurality of blocks, and maintaining, in a second memory, a block temperature for each of a plurality of blocks. The first memory is a read-cache memory where one segment is written at a time, and each block is readable from the first memory without reading the corresponding complete segment. Further, each block temperature is based on a frequency of access to the respective block, and a segment temperature for each segment is based on the block temperature for the corresponding plurality of blocks within the segment.

From operation 1002 the method flows to operation 1004, where a segment is selected with the lowest segment temperature for eviction from the second memory. See for example, segment $S_6$ in FIG. 8.

From operation 1004, the method flows to operation 1006 to identify blocks in the selected segment with a block temperature greater than a threshold temperature. See for example blocks B and C in FIG. 8. From operation 1006 the method flows to operation 1008 where the selected segment is evicted from the first memory. Additionally, in operation 1010, a new segment is written to the first memory, the new segment having the blocks identified for copying forward in operation 1006.

Figure 11:
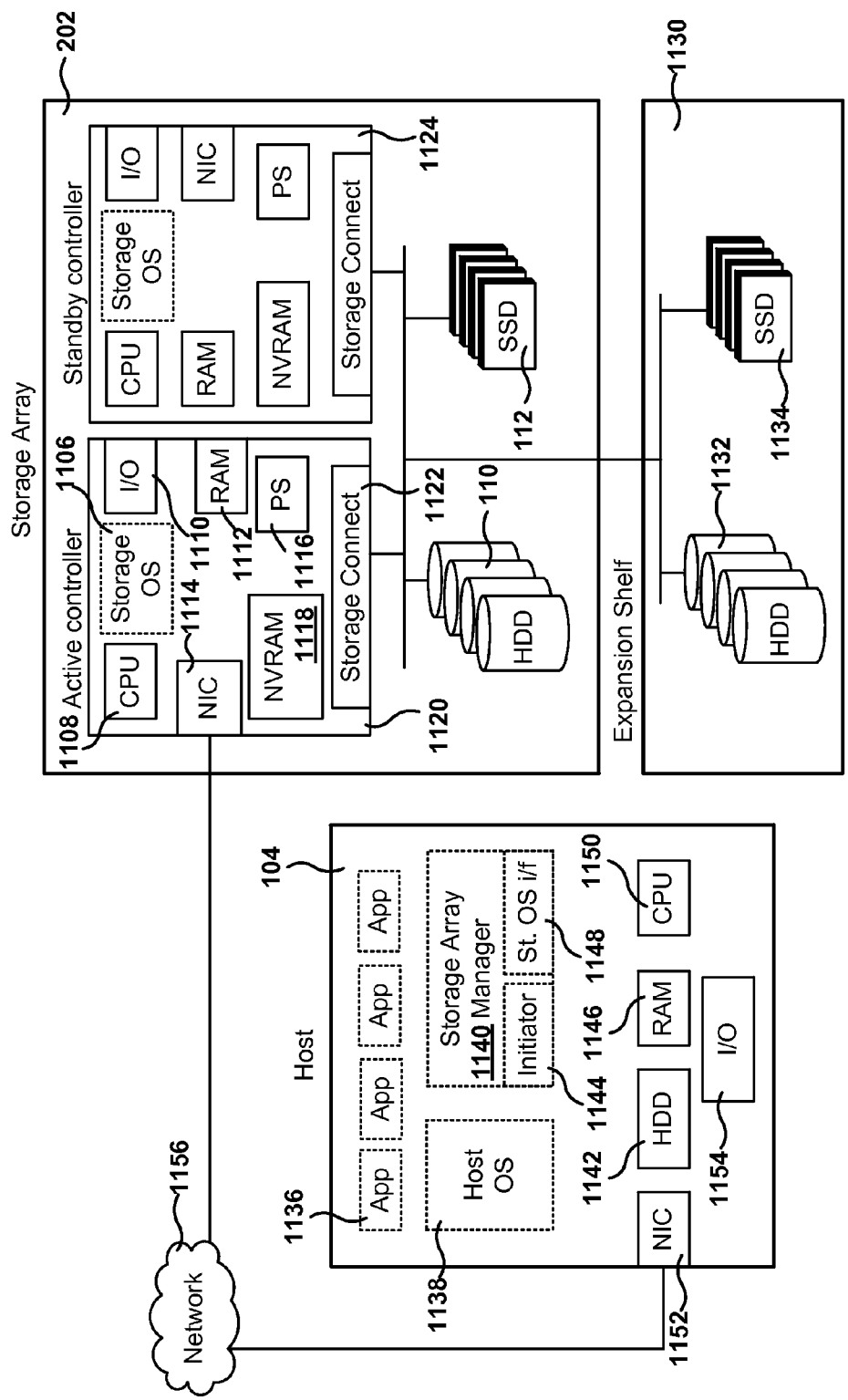
FIG. 11 illustrates an example architecture of a storage array 102, according to one embodiment.

FIG. 11 illustrates an example architecture of a storage array 102, according to one embodiment. In one embodiment, storage array 102 includes an active controller 1120, a standby controller 1124, one or more HDDs 110, and one or more SSDs 112. In one embodiment, the active controller 1120 may be positioned on a left side of an enclosure and the standby controller 1124 may be positioned on a right side of the enclosure for the storage array 102. In one embodiment, the controller 1120 includes non-volatile RAM (NVRAM) 1118, which is for storing the incoming data as it arrives to the storage array. After the data is processed (e.g., compressed and organized in segments (e.g., coalesced)), the data is transferred from the NVRAM 1118 to HDD 110, or to SSD 112, or to both.

In addition, the active controller 1120 further includes CPU 1108, general-purpose RAM 1112 (e.g., used by the programs executing in CPU 1108), input/output module 1110 for communicating with external devices (e.g., USB port, terminal port, connectors, plugs, links, etc.), one or more network interface cards (NICs) 1114 for exchanging data packages through network 1156, one or more power supplies 1116, a temperature sensor (not shown), and a storage connect module 1122 for sending and receiving data to and from the HDD 110 and SSD 112. In one embodiment, the NICs 1114 may be configured for Ethernet communication or Fibre Channel communication, depending on the hardware card used and the storage fabric. In other embodiments, the storage array 102 may be configured to operate using the iSCSI transport or the Fibre Channel transport.

Active controller 1120 is configured to execute one or more computer programs stored in RAM 1112. One of the computer programs is the storage operating system (OS) used to perform operating system functions for the active controller device. In some implementations, one or more expansion shelves 1130 may be coupled to storage array 102 to increase HDD 1132 capacity, or SSD 1134 capacity, or both.

Active controller 1120 and standby controller 1124 have their own NVRAMs, but they share HDDs 110 and SSDs 112. The standby controller 1124 receives copies of what gets stored in the NVRAM 1118 of the active controller 1120 and stores the copies in its own NVRAM. If the active controller 1120 fails, standby controller 1124 takes over the management of the storage array 102. When servers, also referred to herein as hosts, connect to the storage array 102, read/write requests (e.g., 10 requests) are sent over network 1156, and the storage array 102 stores the sent data or sends back the requested data to host 104.

Host 104 is a computing device including a CPU 1150, memory (RAM) 1146, permanent storage (HDD) 1142, a NIC card 1152, and an IO module 1154. The host 104 includes one or more applications 1136 executing on CPU 1150, a host operating system 1138, and a computer program storage array manager 1140 that provides an interface for accessing storage array 102 to applications 1136. Storage array manager 1140 includes an initiator 1144 and a storage OS interface program 1148. When an IO operation is requested by one of the applications 1136, the initiator 1144 establishes a connection with storage array 102 in one of the supported formats (e.g., iSCSI, Fibre Channel, or any other protocol). The storage OS interface 1148 provides console capabilities for managing the storage array 102 by communicating with the active controller 1120 and the storage OS 1106 executing therein. It should be understood, however, that specific implementations may utilize different modules, different protocols, different number of controllers, etc., while still being configured to execute or process operations taught and disclosed herein.

Figure 12:
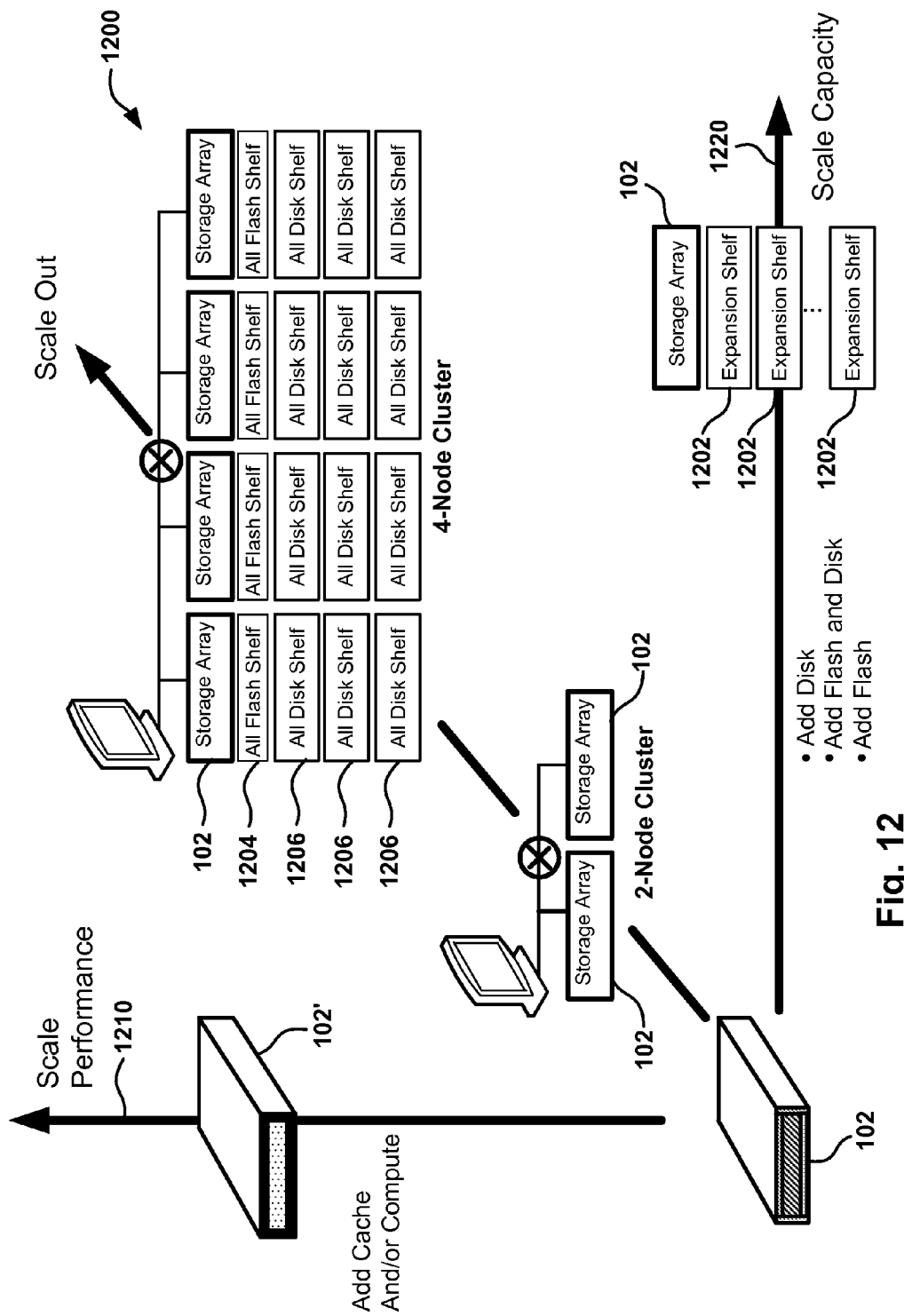
FIG. 12 is an example of the flexibility of the storage array, which can be expanded for scaling performance and for scaling capacity.

FIG. 12 is an example 1200 of the flexibility of the storage array 102, which can be expanded for scaling performance 1210 and for scaling capacity 1220. In this illustration, the storage array can be adjusted to add cache and/or compute resources to define a more powerful storage array 102'. In one example, instead of upgrading the storage array 102, an upgraded storage array 102 can take its place to provide additional processing power (e.g., more powerful CPUs, higher capacity NVRAM, higher capacity DRAM, improved storage enclosure routing and buses, improved fan speeds, modified enclosure (e.g., chassis) heights (U1, U2, U3, etc.), different power supplies, and/or other redundancy and/or memory and/or processing infrastructure.

In one embodiment, if the storage array requires additional disk or storage or flash storage memory, the storage array can be expanded to scale out 1220 by adding expansion shelves 1202 to the storage array 102. As discussed above, the expansion shelves 1202 may be defined by all-disk shelves (ADS) or all-flash shelves (AFS), or combinations of ADS and AFS shelves.

In a further example, the flexibility of the storage array 102 is shown by its ability to be clustered into various sizes, which take into consideration both the scaling of performance and the scaling of capacity, which is referred to herein as "scaling-out" or "scale-out" of the storage array implementation. As shown, if additional processing power is required and additional storage capacity is required, storage arrays can be clustered together, such as to define a two-node cluster. In other embodiments, if an increased level of storage is required and processing power, multiple storage arrays can be clustered together, such as in the example of a four-node cluster.

The four-node cluster is provided such that each storage array is expanded by an all flash shelf 1204 and various all-disk shelves 1206. In some embodiments, fewer all-disk shelves can be coupled to each of the arrays that are clustered together. In still other embodiments, some clustered arrays may not be included in all flash shelves but only additional one or more of all-disk shelves. Still further, some embodiments may be more symmetric such as the four-node cluster example shown in FIG. 12.

Thus, the embodiments described herein enable the scaling of capacity and performance beyond the physical limitations of a single storage array by seamlessly clustering any combination of storage hybrid arrays. An advantage of clustering is that performance can be managed to avoid capacity silos and performance hotspots, and enables easy management of all hardware resources across the cluster as a single storage entity.

In one embodiment, as mentioned above, the storage OS that executes a storage algorithm is capable of taking thousands of point-in-time instant snapshots of volumes by creating a copy of the volumes' indices. Any updates to existing data or new data written to a volume are redirected to free space. In one example implementation, no performance impact due to snapshot processing is taken, as snapshots take little incremental space when only changes are maintained. This also simplifies restoring snapshots, as no data needs to be copied.

Other embodiments are also provided, wherein some or all of the snapshots can be entirely and uniquely taken, wherein no incremental type snapshot is processed. Thus, it should be understood that a variety of implementations and modifications can be made and still enable the snapshot management to be processed by the storage OS of the storage array 102, in accordance with one or more embodiments. In another embodiment, processing by the storage OS enables efficient replication of data to another array by transferring compressed, block-level changes only. These remote copies can be made active if the primary array becomes unavailable. This makes deploying disaster data recovery easy and affordable—especially over a WAN to a remote array where bandwidth is limited.

One or more embodiments can also be fabricated as computer readable code on a non-transitory computer readable storage medium. The non-transitory computer readable storage medium is any non-transitory data storage device that can store data, which can be thereafter be read by a computer system. Examples of the non-transitory computer readable storage medium include hard drives, network attached storage (NAS), read-only memory, random-access memory, CD-ROMs, CD-Rs, CD-RWs, magnetic tapes and other optical and non-optical data storage devices. The non-transitory computer readable storage medium can include computer readable storage medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:
1. A method comprising:
maintaining, in a first memory, a plurality of segments, each segment including a plurality of blocks, and maintaining, in a second memory, a block temperature for each of a plurality of blocks, wherein the first memory is a read-cache memory where one segment is written at a time, wherein each block is readable from the first memory without reading the corresponding complete segment, each block temperature being based on a frequency of access to the respective block, wherein a segment temperature for each segment is based on the block temperature for the corresponding plurality of blocks within the segment;
selecting a segment from a plurality of segments with a lowest segment temperature for eviction from the second memory;
identifying blocks in the selected segment with a block temperature greater than a threshold temperature;
evicting the selected segment from the first memory; and
writing to the first memory a new segment having the identified blocks, wherein writing to the first memory further includes,
storing blocks in a third memory;
creating the new segment with the identified blocks and additional blocks until the segment is full;
storing in a single operation the new segment in the first memory; and
maintaining the temperature of the identified blocks and initializing the temperature of blocks first cached in the first memory.

2. The method as recited in claim 1, wherein the block temperature increases when the block is accessed, wherein the block temperature decreases periodically.

3. The method as recited in claim 1, wherein the segment temperature is equal to a total number of bytes in blocks with temperatures greater than or equal to a temperature threshold.

4. The method as recited in claim 1, wherein the first memory is a solid-state drive (SSD).

5. The method as recited in claim 1, wherein the second memory is one of a random access memory (RAM) or a dynamic random-access memory (DRAM).

6. The method as recited in claim 1, wherein a read-cache memory is a memory acting as a cache for read requests and not acting as a cache for write requests.

7. The method as recited in claim 1, wherein the identified blocks are copied forward by being re-cached in the first memory, wherein blocks in the segment that were not identified are not copied forward.

8. The method as recited in claim 1, wherein selecting a segment further includes:
calculating the segment temperature for segments cached in the first memory; and
selecting the segment with the lowest calculated temperature.

9. The method as recited in claim 1, wherein a non-volatile random-access memory (NVRAM) memory is used as write cache, wherein the segments are formed in the NVRAM and transferred to hard disk storage.

10. A method comprising:
maintaining, in a first memory, a plurality of segments, each segment including a plurality of blocks, and maintaining, in a second memory, a block temperature for each of a plurality of blocks, wherein the first memory is a read-cache memory where one segment is written at a time, wherein each block is readable from the first memory without reading the corresponding complete segment, each block temperature being based on a frequency of access to the respective block, wherein a segment temperature for each segment is based on the block temperature for the corresponding plurality of blocks within the segment;
selecting a segment from a plurality of segments with a lowest segment temperature for eviction from the second memory;
identifying blocks in the selected segment with a block temperature greater than a threshold temperature;
evicting the selected segment from the first memory; and
writing to the first memory a new segment having the identified blocks;
wherein each block is associated with a volume, wherein each segment is operable to include blocks from one volume and each segment is operable to include blocks from a plurality of volumes;
wherein each block has a first block address defined by a corresponding volume and an offset within the volume, the method further including:
translating the first block address to a second block address defined by a segment where the block is stored and an offset within the segment; and
identifying an ordinal of the block within the segment based on the offset of the second block address.

11. A method comprising:
maintaining, in a first memory, a plurality of segments, each segment including a plurality of blocks, and maintaining, in a second memory, a block temperature for each of a plurality of blocks, wherein the first memory is a read-cache memory where one segment is written at a time, wherein each block is readable from the first memory without reading the corresponding complete segment, each block temperature being based on a frequency of access to the respective block, wherein a segment temperature for each segment is based on the block temperature for the corresponding plurality of blocks within the segment;
selecting a segment from a plurality of segments with a lowest segment temperature for eviction from the second memory;
identifying blocks in the selected segment with a block temperature greater than a threshold temperature;
evicting the selected segment from the first memory;
writing to the first memory a new segment having the identified blocks; and
identifying a second plurality of segments whose block temperature is not maintained for the blocks in the segments, wherein the segment temperature for the second plurality of segments is equal to a number of active bytes in the segment.

12. A method comprising:
maintaining, in a first memory, a plurality of segments, each segment including a plurality of blocks, and maintaining, in a second memory, a block temperature for each of a plurality of blocks, wherein the first memory is a read-cache memory where one segment is written at a time, wherein each block is readable from the first memory without reading the corresponding complete segment, each block temperature being based on a frequency of access to the respective block, wherein a segment temperature for each segment is based on the block temperature for the corresponding plurality of blocks within the segment;
selecting a segment from a plurality of segments with a lowest segment temperature for eviction from the second memory;
identifying blocks in the selected segment with a block temperature greater than a threshold temperature;
evicting the selected segment from the first memory;
writing to the first memory a new segment having the identified blocks; and
identifying a third plurality of segments utilizing a first in first out (FIFO) process for being cached in the first memory, wherein the segment temperature for the third plurality of segments is equal to a predetermined fixed value.

13. A system comprising:
a first memory for storing a plurality of segments, each segment including a plurality of blocks, wherein the first memory is a read-cache memory where one segment is written at a time, wherein each block is readable from the first memory without reading the corresponding complete segment;
a second memory for storing a block temperature for each of the plurality of blocks, each block temperature being based on a frequency of access to the respective block, wherein a segment temperature for each segment is based on the block temperature for the corresponding plurality of blocks within the segment; and
a processor operable to select a segment from a plurality of segments with a lowest segment temperature for eviction from the second memory, wherein the processor identifies blocks in the selected segment with a block temperature greater than a threshold temperature, wherein the selected segment is evicted from the first memory and a new segment having the identified blocks is written to the first memory, wherein the writing to the first memory further includes making the processor operable to,
store blocks in a third memory;
create the new segment with the identified blocks and additional blocks until the segment is full;
store in a single operation the new segment in the first memory; and
maintain the temperature of the identified blocks and initializing the temperature of blocks first cached in the first memory.

14. The system as recited in claim 13, further including:
hard disk storage for keeping all blocks in non-volatile memory.

15. The system as recited in claim 14, further including:
a non-volatile random-access memory (NVRAM) memory used as a write-cache memory, wherein the segments are formed in the NVRAM and transferred to the hard disk storage.

16. The system as recited in claim 13, wherein blocks are of variable length.

17. A non-transitory computer-readable storage medium storing a computer program, the computer-readable storage medium comprising:
program instructions for maintaining, in a first memory, a plurality of segments, each segment including a plurality of blocks, and maintaining, in a second memory, a block temperature for each of a plurality of blocks, wherein the first memory is a read-cache memory where one segment is written at a time, wherein each block is readable from the first memory without reading the corresponding complete segment, each block temperature being based on a frequency of access to the respective block, wherein a segment temperature for each segment is based on the block temperature for the corresponding plurality of blocks within the segment;
program instructions for selecting a segment from a plurality of segments with a lowest segment temperature for eviction from the second memory;
program instructions for identifying blocks in the selected segment with a block temperature greater than a threshold temperature;
program instructions for evicting the selected segment from the first memory; and
program instructions for writing to the first memory a new segment having the identified blocks, wherein writing to the first memory further includes,
program instructions for storing blocks in a third memory;
program instructions for creating the new segment with the identified blocks and additional blocks until the segment is full;
program instructions for storing in a single operation the new segment in the first memory; and
program instructions for maintaining the temperature of the identified blocks and initializing the temperature of blocks first cached in the first memory.

18. The storage medium as recited in claim 17, wherein the first memory is a solid-state drive (SSD), wherein the second memory is one of a random access memory (RAM) or a dynamic random-access memory (DRAM).

* * * * *